(12) United States Patent
Pratt

(10) Patent No.: US 9,136,259 B2
(45) Date of Patent: Sep. 15, 2015

(54) METHOD OF CREATING ALIGNMENT/CENTERING GUIDES FOR SMALL DIAMETER, HIGH DENSITY THROUGH-WAFER VIA DIE STACKING

(75) Inventor: Dave Pratt, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 1742 days.

(21) Appl. No.: 12/101,776

(22) Filed: Apr. 11, 2008

(65) Prior Publication Data

US 2009/0255705 A1 Oct. 15, 2009

(51) Int. Cl.
*H01L 21/00* (2006.01)
*H01L 25/00* (2006.01)
(Continued)

(52) U.S. Cl.
CPC ............. *H01L 25/50* (2013.01); *H01L 23/481* (2013.01); *H01L 24/12* (2013.01); *H01L 24/81* (2013.01); *H01L 25/0657* (2013.01); *H01L 2224/10135* (2013.01); *H01L 2224/10165* (2013.01); *H01L 2224/13009* (2013.01); *H01L 2224/13099* (2013.01); *H01L 2224/13147* (2013.01); *H01L 2224/8014* (2013.01); *H01L 2224/8114* (2013.01); *H01L 2224/81136* (2013.01); *H01L 2224/81139* (2013.01); *H01L 2224/81141* (2013.01); *H01L 2224/81801* (2013.01); *H01L 2225/06513* (2013.01); *H01L 2225/06541* (2013.01); *H01L 2924/014* (2013.01); *H01L 2924/0105* (2013.01); *H01L 2924/01029* (2013.01); *H01L 2924/01033* (2013.01); *H01L 2924/01046* (2013.01); *H01L 2924/01047* (2013.01); *H01L 2924/01049* (2013.01); *H01L 2924/01074* (2013.01);

(Continued)

(58) Field of Classification Search
CPC ........... H01L 2224/81136; H01L 2924/01046; H01L 2924/014; H01L 25/50; H01L 23/481; H01L 24/12; H01L 24/81; H01L 24/0657
USPC ......................................................... 438/109
See application file for complete search history.

(56) References Cited

U.S. PATENT DOCUMENTS 4,215,360 A 7/1980 Eytcheson
6,577,013 B1 * 6/2003 Glenn et al. ................... 257/777
(Continued)

FOREIGN PATENT DOCUMENTS

CN 1241297 A 1/2000
JP 2000-252413 9/2000
(Continued)

OTHER PUBLICATIONS

PCT ISRWO dated Aug. 13, 2009.
(Continued)

*Primary Examiner* — Shaun Campbell
(74) *Attorney, Agent, or Firm* — Fletcher Yoder, P.C.

(57) ABSTRACT

A method is provided for forming a die stack. The method includes forming a plurality of through-wafer vias and a first plurality of alignment features in a first die. A second plurality of alignment features is formed in a second die, and the first die is stacked on the second die such that the first plurality of alignment features engage the second plurality of alignment features. A method of manufacturing a die stack is also provided that includes forming a plurality of through-wafer vias on a first die, forming a plurality of recesses on a first die, and forming a plurality of protrusions on a second die. A die stack and a system are also provided.

18 Claims, 10 Drawing Sheets

(51) Int. Cl.
*H01L 23/48* (2006.01)
*H01L 23/00* (2006.01)
*H01L 25/065* (2006.01)

(52) U.S. Cl.
CPC ............ *H01L 2924/01075* (2013.01); *H01L 2924/01078* (2013.01); *H01L 2924/01079* (2013.01); *H01L 2924/14* (2013.01); *Y10T 29/49117* (2015.01)

(56) References Cited

U.S. PATENT DOCUMENTS

| | | | |
|---|---|---|---|
| 6,969,635 B2 * | 11/2005 | Patel et al. | 438/107 |
| 7,101,730 B2 | 9/2006 | Bolken et al. | |
| 7,354,798 B2 | 4/2008 | Pogge et al. | |
| 7,405,487 B2 * | 7/2008 | Brand | 257/797 |
| 2002/0190396 A1 | 12/2002 | Brand | |
| 2003/0111727 A1 * | 6/2003 | Kurusu | 257/730 |
| 2004/0173894 A1 | 9/2004 | Glenn | |
| 2005/0064707 A1 | 3/2005 | Sinha | |
| 2005/0161837 A1 | 7/2005 | Matsui | |
| 2006/0118939 A1 * | 6/2006 | Fisher et al. | 257/690 |
| 2006/0121690 A1 * | 6/2006 | Pogge et al. | 438/455 |
| 2007/0182020 A1 * | 8/2007 | Trezza et al. | 257/777 |
| 2007/0241078 A1 | 10/2007 | Pratt et al. | |
| 2007/0269994 A1 | 11/2007 | Pratt et al. | |
| 2008/0057620 A1 | 3/2008 | Pratt | |

FOREIGN PATENT DOCUMENTS

| | | |
|---|---|---|
| JP | 2002-076247 | 3/2002 |
| JP | 2003-197855 | 7/2003 |
| JP | 2007-194669 | 8/2007 |

OTHER PUBLICATIONS

Singapore Written Opinion dated Jan. 5, 2012.
Chinese Office Action dated Apr. 23, 2012.
Japanese Office Action dated Jun. 18, 2012.
Taiwan Office Action dated Jan. 17, 2013.
Taiwan Office Action dated Jun. 28, 2013.
Taiwan Patent Application No. 103103968 Search Report Mailed Mar. 6, 2015.

* cited by examiner

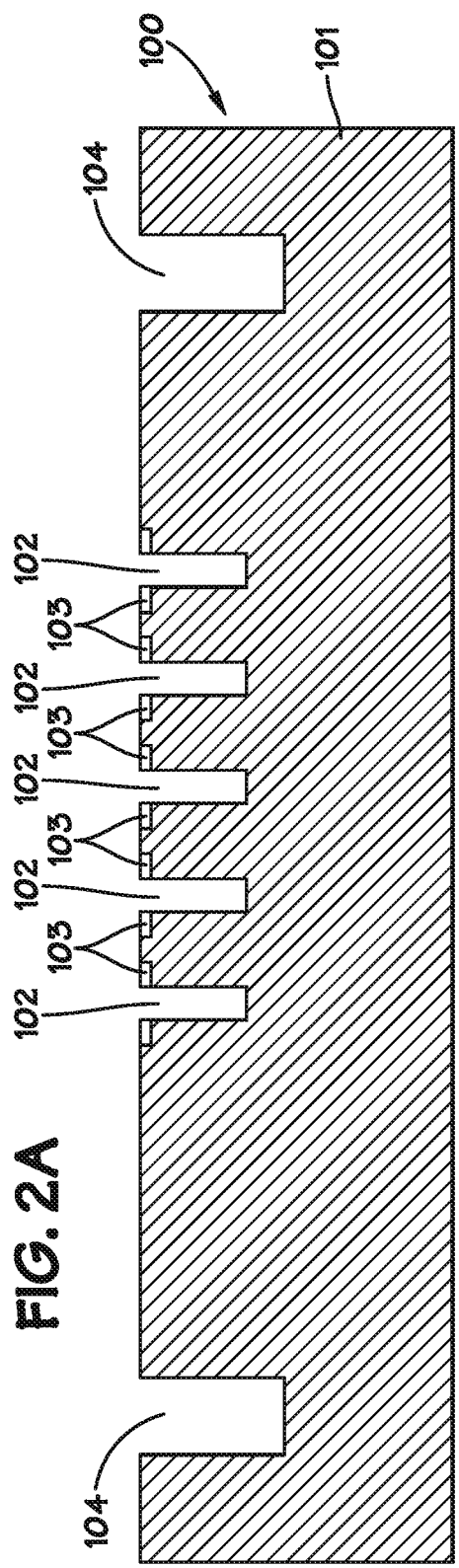
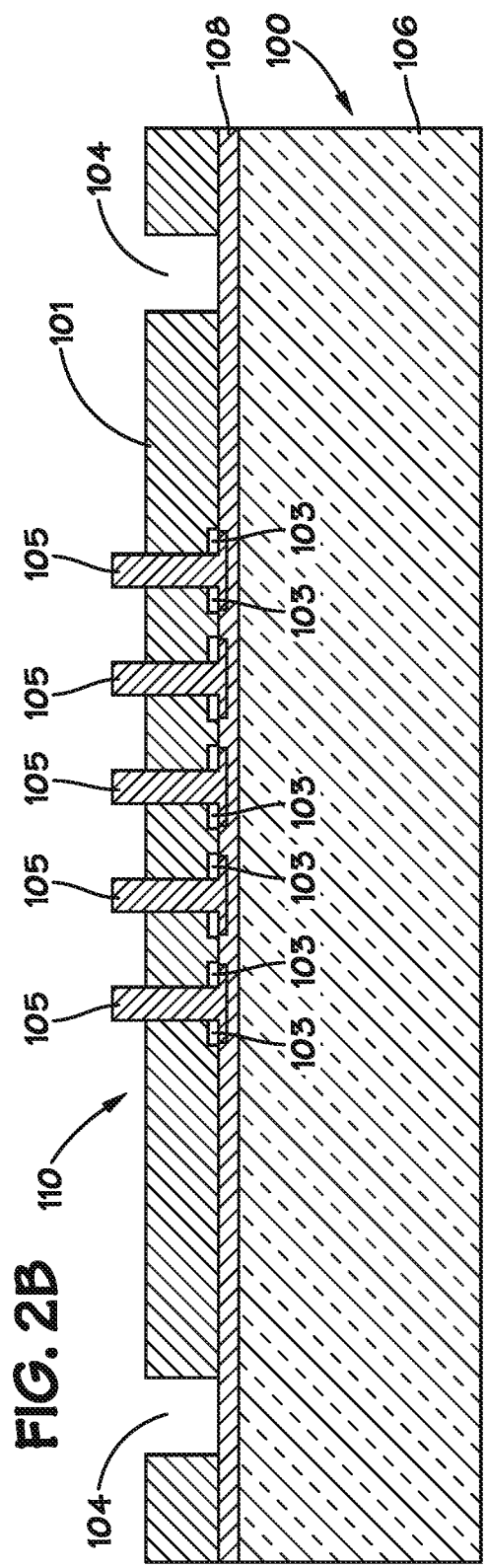

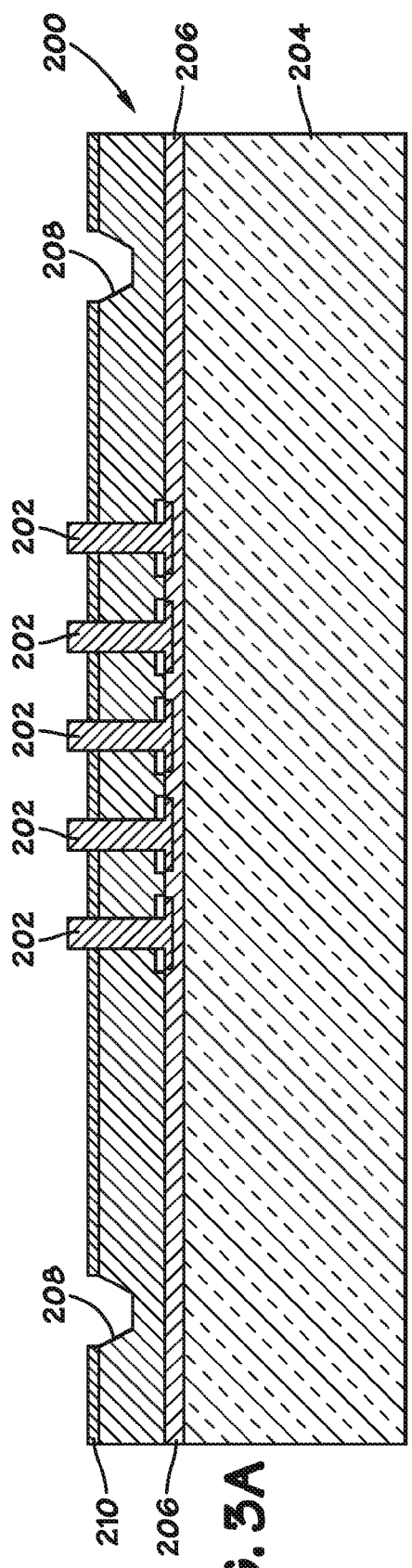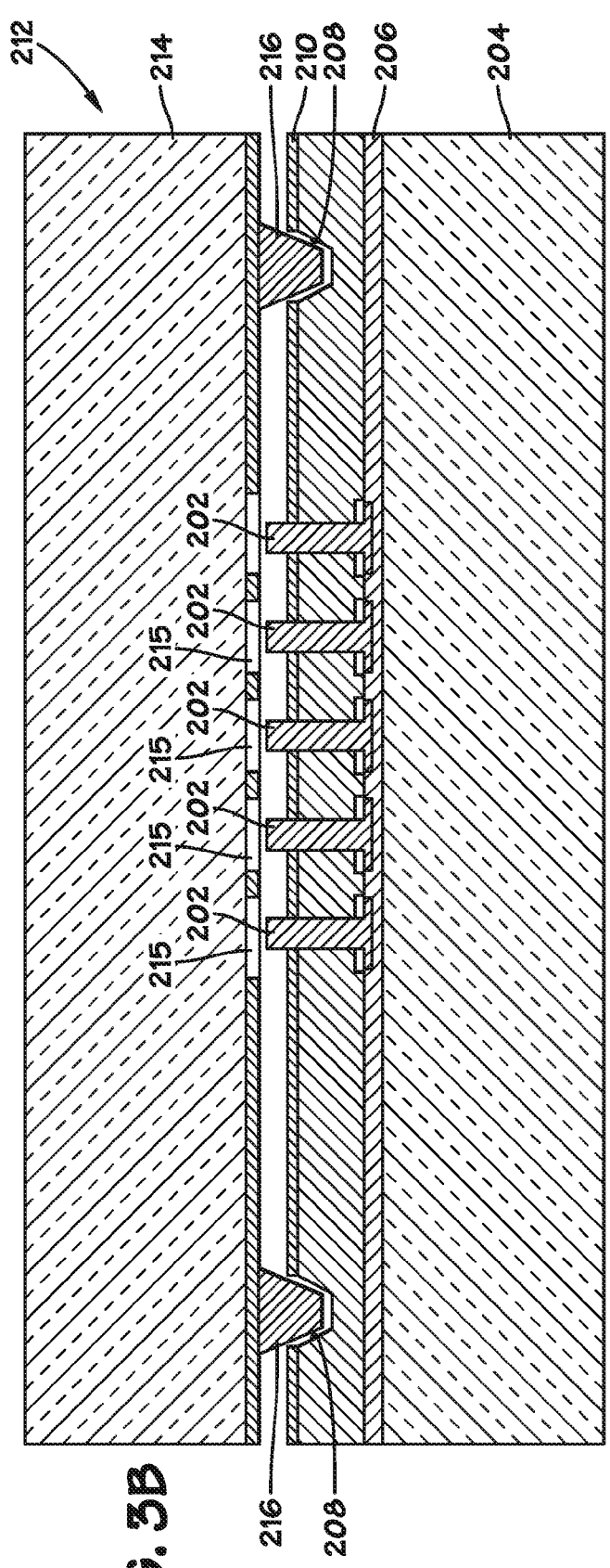

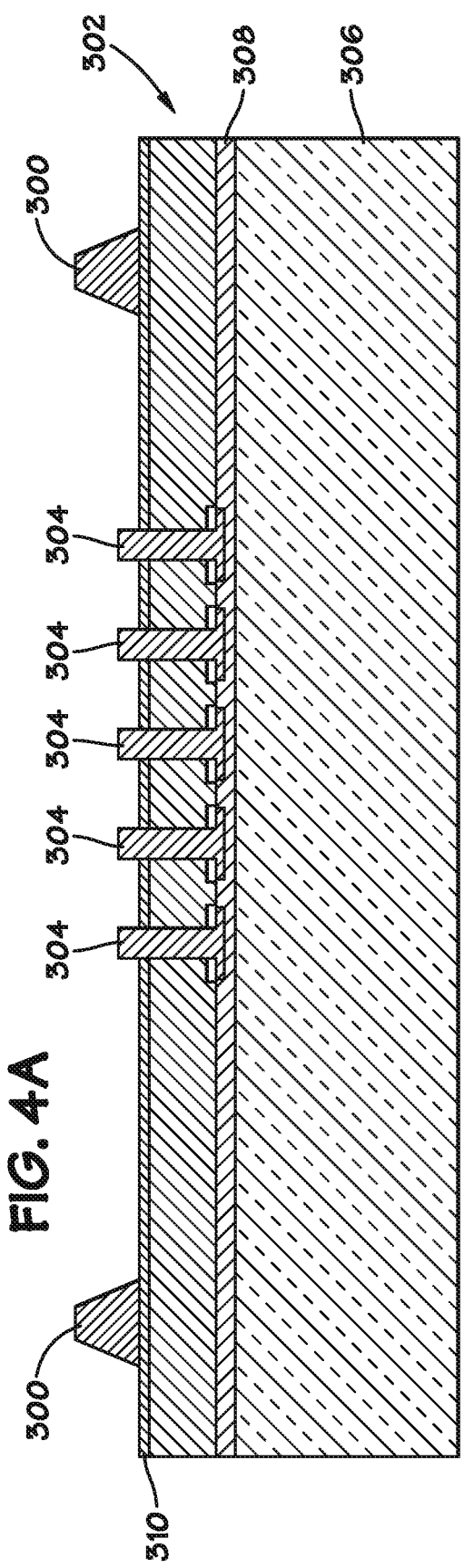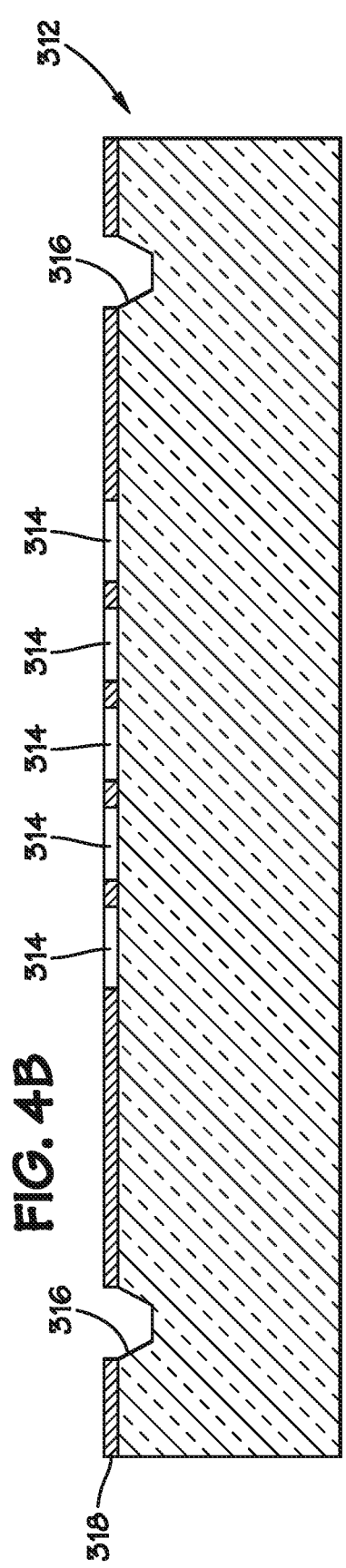

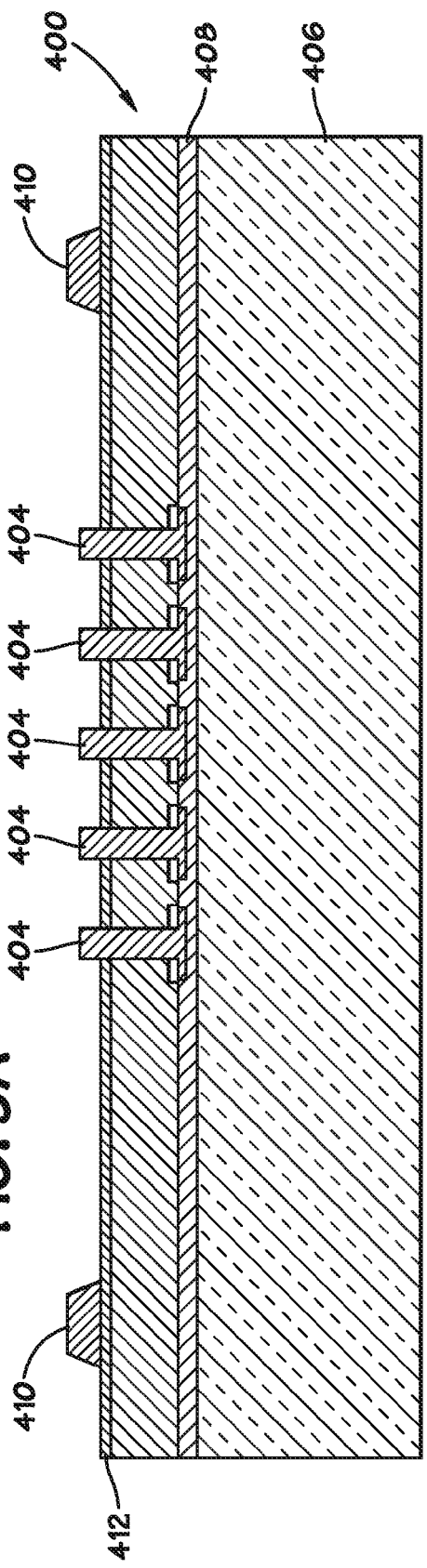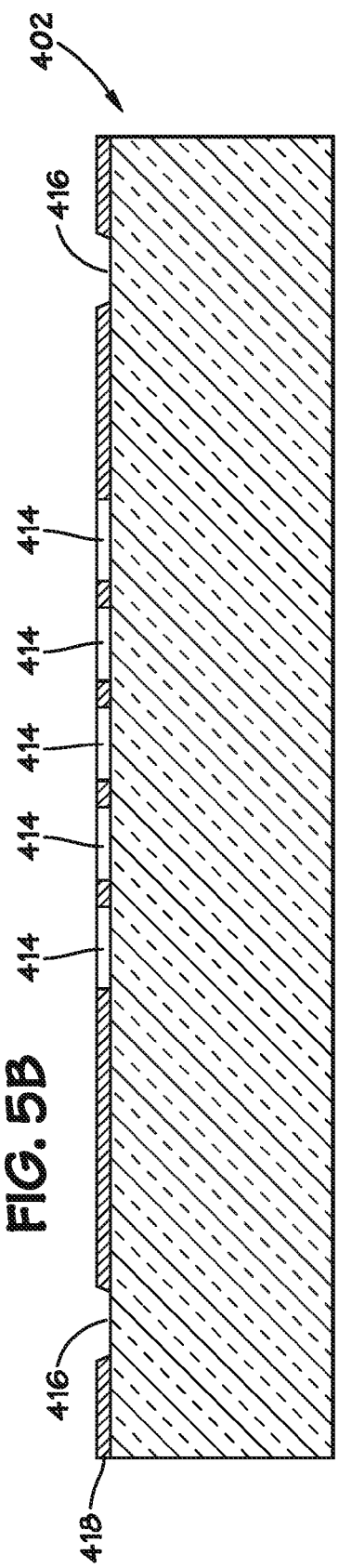
FIG. 5A
FIG. 5B

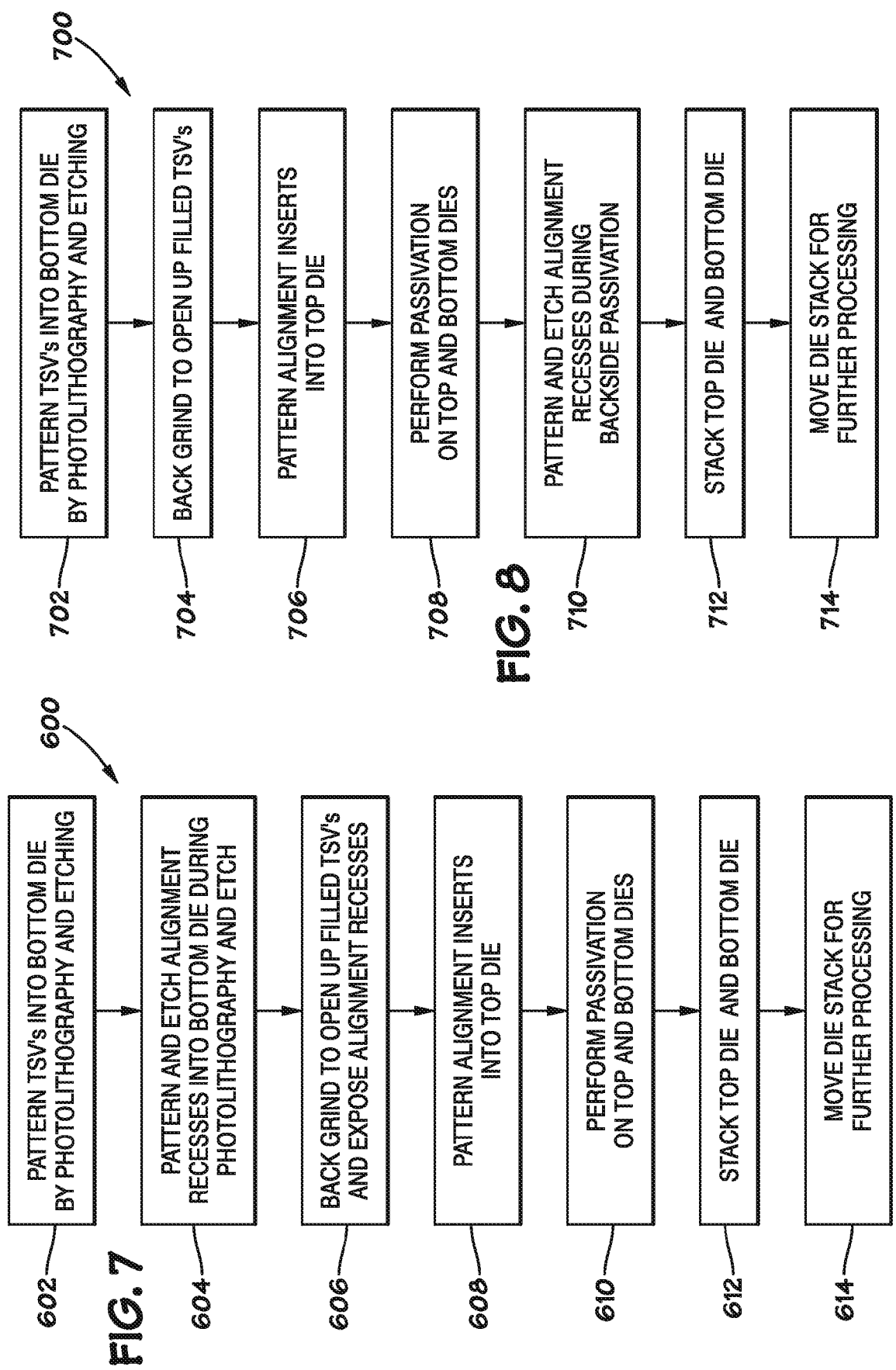

METHOD OF CREATING ALIGNMENT/CENTERING GUIDES FOR SMALL DIAMETER, HIGH DENSITY THROUGH-WAFER VIA DIE STACKING

BACKGROUND OF THE INVENTION

1. Field of the Invention

The present invention relates generally to semiconductor devices and, more particularly, to stackable dies using through-wafer vias.

2. Description of the Related Art

Microprocessor-controlled circuits are used in a wide variety of applications. Such applications include personal computers, cellular phones, digital cameras, control systems, and a host of other consumer products. A personal computer, digital camera, or the like, generally includes various components, such as microprocessors, that handle different functions for the system. By combining these components, various consumer products and systems may be designed to meet specific needs. Microprocessors are essentially generic devices that perform specific functions under the control of software programs. These software programs are generally stored in one or more memory devices that are coupled to the microprocessor and/or other peripherals.

Electronic components, such as microprocessors and memory devices, often include numerous integrated circuits manufactured on a semiconductor substrate and coupled together in a package. To increase the density of the circuits, the circuits may be stacked vertically, reducing the 'footprint' of the circuit. To further reduce the footprint of the circuit and improve electrical connectivity between the dies, the dies may be interconnected by through-wafer vias (e.g. through-silicon vias or TSVs) in which a via passes through the silicon of the dies to provide vertical interconnection. By replacing ribbons, solder wires, or other connection technology typically located on the edge of the dies with TSVs, the length and width of the circuit may be reduced. Additionally, use of TSVs for interconnection may eliminate the need for an interposer between dies. However, because the TSVs must align throughout the stacked dies of the circuit, alignment of the dies during manufacturing may present challenges, especially with respect to small diameter and/or higher density TSVs.

BRIEF DESCRIPTION OF THE DRAWINGS

FIGS. 2A-2D illustrate formation of alignment recesses and protrusions in accordance with an embodiment of the present invention;

FIGS. 3A-3B illustrate formation of alignment recesses and protrusions in accordance with another embodiment of the present invention;

FIGS. 4A-4C illustrate formation of alignment recesses and protrusions in accordance with another embodiment of the present invention;

FIGS. 5A and 5B illustrate formation of alignment recesses and protrusions in accordance with another embodiment of the present invention;

FIG. 7 depicts a process for forming alignment features in accordance with an embodiment of the present invention;

FIG. 8 depicts a process for forming alignment features during passivation processes in accordance with another embodiment of the present invention.

DETAILED DESCRIPTION OF SPECIFIC EMBODIMENTS

Figure 1:
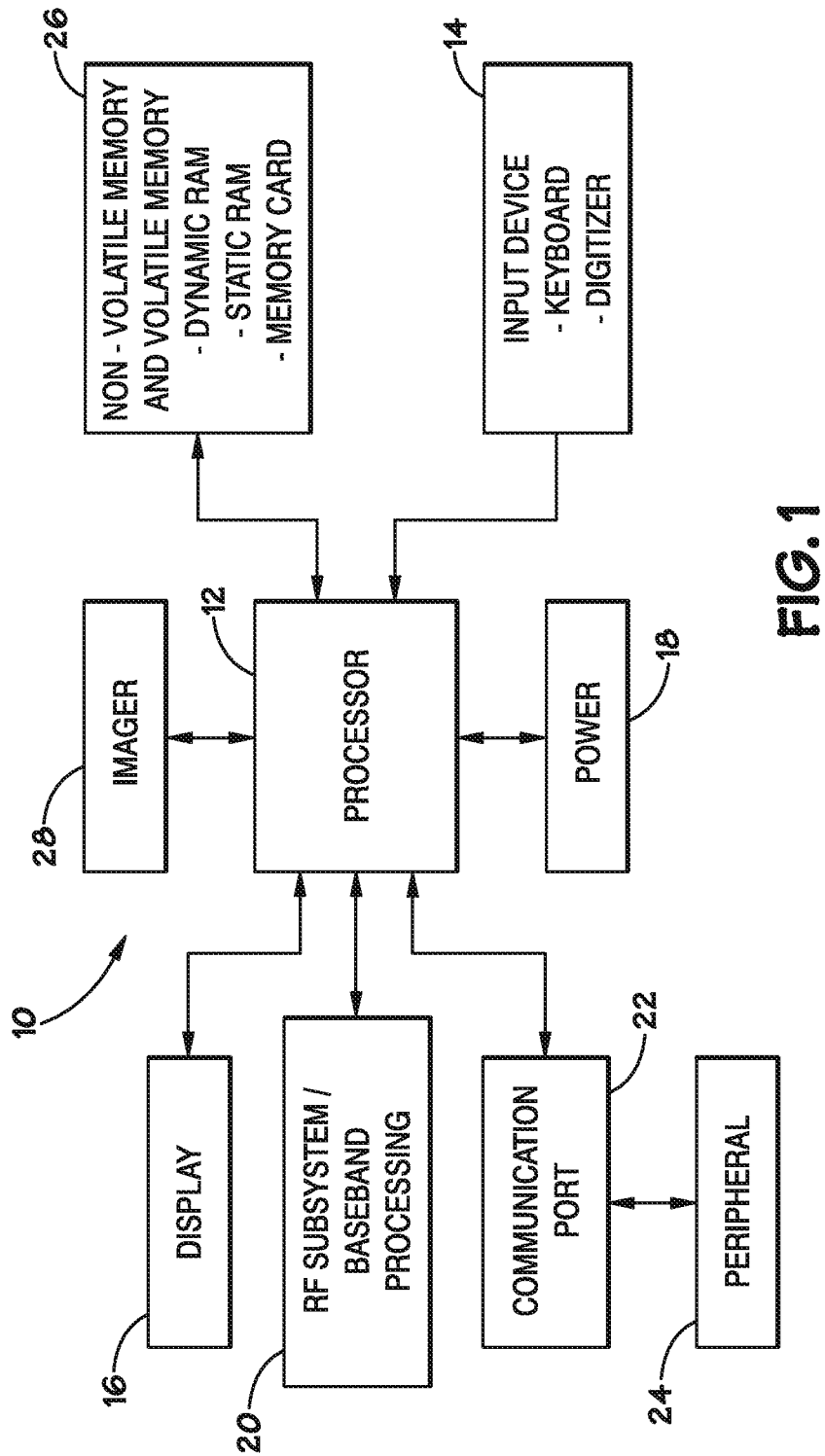
FIG. 1 illustrates a block diagram of a processor-based device in accordance with an embodiment of the present invention.

FIG. 1 is a block diagram of an electronic system containing integrated circuit devices that may employ embodiments of the present invention. The electronic device or system, which is generally indicated by the reference numeral 10, may be any of a variety of types, such as a computer, digital camera, cellular phone, personal organizer, or the like. In a typical processor-based device, a processor 12, such as a microprocessor, controls the operation of system functions and requests.

Various devices may be coupled to the processor 12 depending on the functions that the system 10 performs. For example, an input device 14 may be coupled to the processor 12 to receive input from a user. The input device 14 may comprise a user interface and may include buttons, switches, a keyboard, a light pen, a mouse, a digitizer, a voice recognition system, or any of a number of other input devices. An audio or video display 16 may also be coupled to the processor 12 to provide information to the user. The display 16 may include an LCD display, a CRT display, or LEDs, for example. Further, the system 10 may include a power supply 18, which may comprise a battery or batteries, a battery receptor, an AC power adapter, or a DC power adapter, for instance. The power supply 18 may provide power to one or more components of the system 10.

An RF sub-system/baseband processor 20 may be coupled to the processor 12 to provide wireless communication capability. The RF subsystem/baseband processor 20 may include an antenna that is coupled to an RF receiver and to an RF transmitter (not shown). Furthermore, a communications port 22 may be adapted to provide a communication interface between the electronic system 10 and a peripheral device 24. The peripheral device 24 may include a docking station, expansion bay, or other external component.

The processor 12 may be coupled to various types of memory devices to facilitate its operation. For example, the processor 12 may be connected to memory 26, which may include volatile memory, non-volatile memory, or both. The volatile memory of memory 26 may comprise a variety of memory types, such as static random access memory ("SRAM"), dynamic random access memory ("DRAM"), first, second, or third generation Double Data Rate memory ("DDR1", "DDR2", or "DDR3", respectively), or the like. The non-volatile memory of the memory 26 may comprise various types of memory such as electrically programmable read only memory ("EPROM") or flash memory, for example. Additionally, the non-volatile memory may include a high-capacity memory such as a tape or disk drive memory.

The system 10 may include multiple semiconductor devices. For example, in addition to the processor 12 and the memory 26, the system 10 may also include an image sensor or imager 28 coupled to the processor 12 to provide digital imaging functionality. The imager 28 may include a charge coupled device (CCD) sensor or a complementary metal oxide semiconductor (CMOS) sensor having an array of photoreceptors or pixel cells configured to be impacted by photons and to convert such impact into electrical current via the photoelectric effect. While the imager 28 may be coupled remotely from the processor 12, such as by way of a circuit board, the imager 28 and processor 12 may instead be integrally formed, such as on a common substrate.

The processor 12, memory 26, imager 28, and any other device or component of the system 10 may be an integrated circuit or package fabricated in accordance with the techniques described further below. For example, a processor 12 may be an integrated circuit having two or more dies stacked in a vertical arrangement. As discussed above, the dies may be electrically interconnected by through-wafer vias passing through each die. However, as the pitch and diameter decrease in size to accommodate smaller dies and a smaller footprint for the integrated circuit, alignment of the dies during the die stacking process is critical for alignment of the through-wafer vias and proper operation of the integrated circuit.

FIGS. 2-6 illustrate formation of alignment recesses and protrusions to facilitate alignment of through-wafer vias during die stacking according to an embodiment of the present invention. As will be appreciated, a wafer may include any number of dies that may be processed according to the techniques described below. For example, although the techniques disclosed herein are discussed in the context of one or more dies, such as a bottom die and a top die, the processing may be performed on one or more wafers, on one or more individual dies after excision from a wafer, or any combination thereof.

Turning to FIGS. 2A-2D, FIG. 2A illustrates a die 100 that may be placed on the "bottom" of a die stack of an integrated circuit. The die 100 includes a backside surface 101. The die 100 may have a plurality of through-wafer vias 102 etched into the die 100 and extending through the substrate and may also include bond pads 103. For example, the through-wafer vias 102 may have been created during a deep via patterning process, such as photolithography and etching. In addition, during the via patterning process, a plurality of alignment recesses 104 may be patterned and etched into the substrate of the die 100. The alignment recesses 104 may be patterned in selected special arrangements. For example, in one embodiment, the alignment recesses 104 may be patterned and etched at or near the die streets and intersections on a wafer. The alignment recesses 104 may be any size, shape, or depth. However, to ensure the alignment recesses 104 remain open during subsequent processing of the die 100, in an embodiment the alignment recesses 104 may be etched at least or greater than the depth of the through-wafer vias 102.

Turning now to FIG. 2B, once the through-wafer vias 102 and alignment recesses 104 have been patterned and etched, the vias 102 may be filled with copper or other interconnect material such as polysilicon or tungsten. The copper filled vias 105 and the die 100 may be processed through various processes, such as carrier attach, back grinding, silicon relief etch, etc. For example, the TSVs may be exposed on the surface 101 by back grinding the backside of the die 100. To further, the surface 101 of the die 100 may be etched, without etching the TSVs, so that the TSVs extend beyond the surface 101 of the die 100. To facilitate stacking in a die stack, the die 100 may first be flipped so that the backside surface 101 is now exposed for processing. The die 100 may also be placed onto a carrier 106, such as a silicon carrier, and secured by an adhesive 108. During the back grind step to create the TSVs, the alignment recesses 104 may be exposed on the backside 110 of the die 100.

Figure 2C:
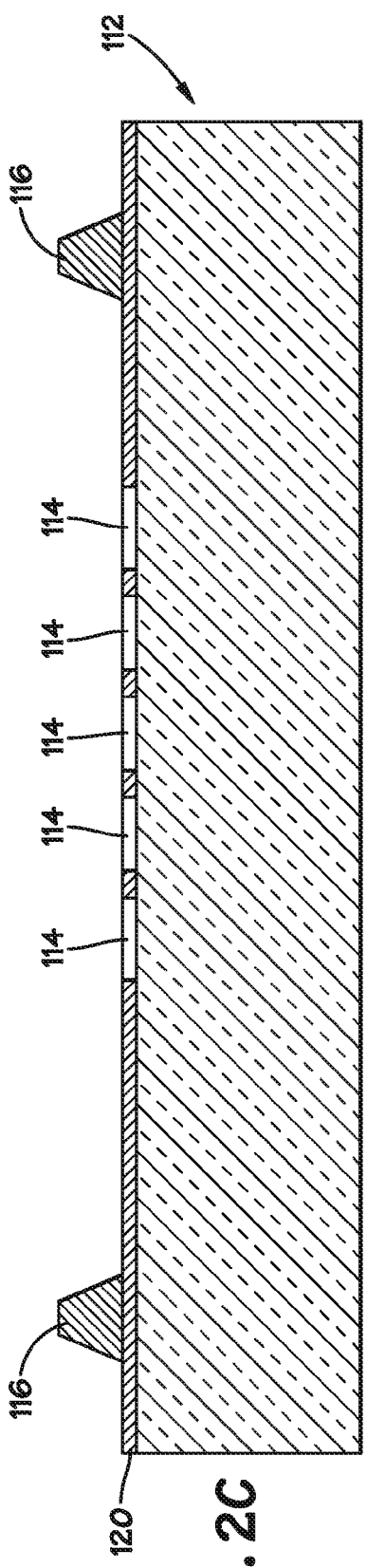

FIG. 2C illustrates another die 112, such as a "top" die, that may be coupled to the "bottom" die 100 in an integrated circuit. The die 112 may include a plurality of bond pads 114 configured to couple to the through-wafer vias of a second or bottom die, such as die 100. To facilitate alignment of the bond pads 114 of the top die 112 with the filled vias 105 of the bottom die 100, the top die may include a plurality of alignment protrusions 116 extending from the substrate of the die 112. The alignment protrusions 116 may be created by any suitable process, such as photolithography, stereolithography, etc. For example, the protrusions may be an angled structure, and may have any degree of slope or verticality, as determined by the resist patterning during a lithography process. Further, the alignment protrusions 116 may be of any shape, size or topography, such as pyramidal, rectangular, tetrahedral, etc. Additionally, the shape, size, or topography of the alignment protrusions 116 may be selected to better match the alignment recesses 104 on the bottom die 100.

Figure 2D:
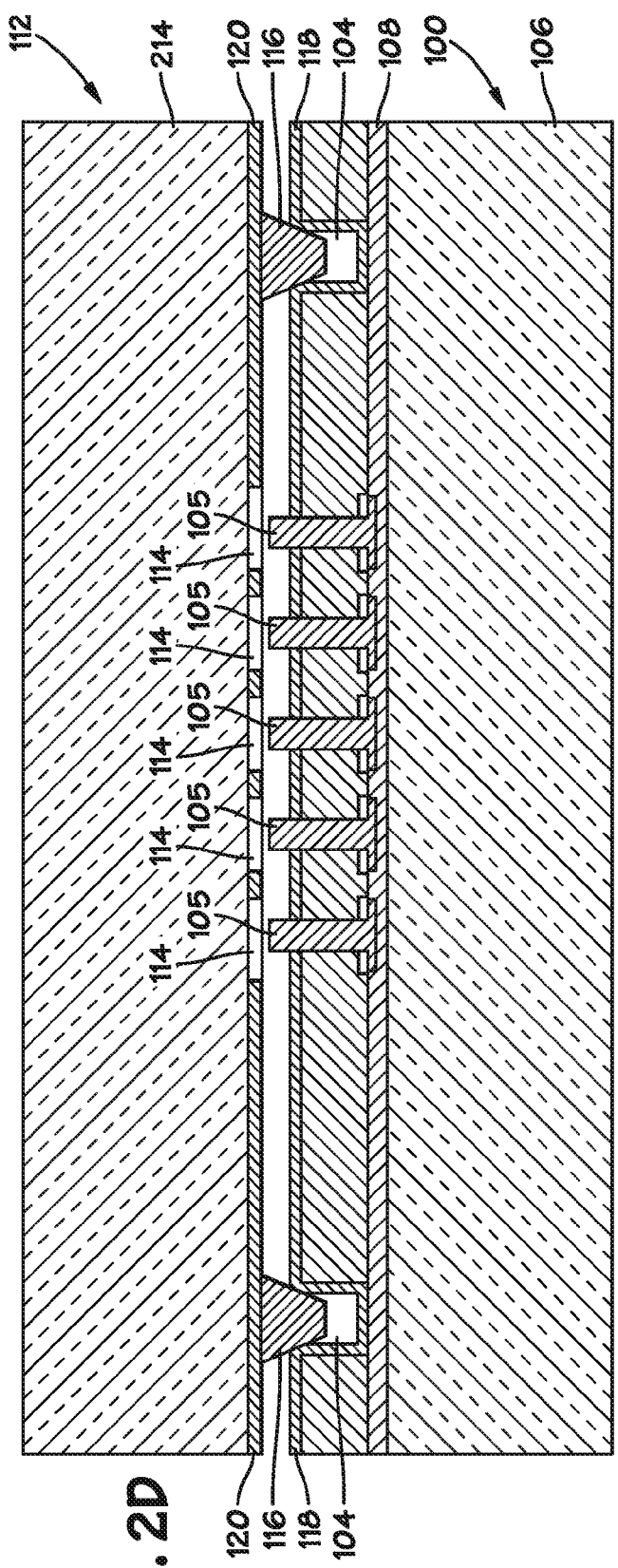

To form a die stack, the top die 112 may be stacked on the bottom die 100 as illustrated in FIG. 2D. Prior to the stacking process, the top die 112 and bottom die 100 may undergo passivation processes. For example, a passivation layer 118 may be created on the bottom die, and a passivation layer 120 may also be created on the top die. The passivation layers 118 and 120 may also be disposed on the alignment recesses 104 and on the top of the alignment protrusions 116 respectively. Advantageously, no additional processing is needed during the passivation step to accommodate the alignment recesses 104 and protrusions 116.

As illustrated in FIG. 2D, the bottom die 100 may have first been placed onto the carrier 106, such as a silicon carrier, and secured by the layer of adhesive 108. As discussed above, to ensure electrical interconnection between the top die 112 and the bottom die 100, the bond pads 114 of the top die 112 should align with the filled-in through-wafer vias 105 of the bottom die 100. To ensure that the bond pads 114 of the top die 112 and the through-wafer vias 105 of the bottom die 100 align, the alignment protrusions 116 of the top die may engage the recesses 104 on the bottom die 100. Thus, during the die stacking process, alignment of the bond pads 114 and the through-wafer vias 102 is not limited to the accuracy of the tool performing the stacking the operation. Instead, the alignment protrusions 116 and recesses 104, creating during a more accurate lithography and etching process, provide better alignment accuracy and ensure that the bottom die 100 and top die 112 are stacked in a specific alignment.

Once the dies have been stacked, the stacked dies may then be moved for further processing, such as for reflow of the bond pad and through-wafer via connections, underfilling, etc. The electrical contact between the bond pad and the through-wafer vias may be facilitated by any suitable technology. For example, solder balls may be disposed on the bond pads 114 to contact the filled vias 105. For smaller pitch vias and bond pads, the contact may be facilitated by any other suitable technology, such as: deposition of an under bump metallurgy (UBM) material, such as a nickel/palladium/gold metal, on the vias 105 and the bond pads 114; deposition of metals such as tin, indium/gold, or other metals on the bond pads 114 and/or the vias 105; thermosonic bonding, and/or plating a solder mask on the bond pads 114.

The die stack must then be moved from the stacking location, e.g. the pick and place tool, to the next step in the process. Any movement of the bottom die 100 relative to the top die 112 may affect the contact between the bond pad 114 and the through-wafer vias 102, resulting in poor or no connections and affecting the yield of the die stacks. The alignment recesses 104 and protrusions 116 may provide an additional "interlocking" function to prevent movement of the bottom die 100 and top die 112 during relocation of the die stack. For example, the contact between the alignment protrusions 116 of the top die 112 and the alignment recesses 104 of the bottom die 100 prevent movement of the dies 100 and 112, as well as providing the alignment function during stacking.

FIGS. 3A and 3B illustrate formation of alignment recesses and protrusions according to another embodiment of the present invention. FIG. 3A depicts a first die 200, such as a bottom die, having a plurality of through-wafer vias 202, disposed on a silicon carrier 204 and secured by an adhesive layer 206. As illustrated in FIG. 3A, the die 200 has already been through the necessary processing to create and fill the through-wafer vias 202. In this embodiment, a plurality of alignment recesses 208 may be formed during a backside passivation process, e.g. after formation and filling of the through-wafer vias. A passivation layer 210 may have been formed before formation of the alignment recesses 208. After formation of the passivation layer 210, the alignment recesses 208 may be patterned and etched, such as by dry or wet etch or any suitable process. The alignment recesses 208 may be etched at any desired depth or angle, and may be any size, shape or topography. For example, the recesses 208 may be etched using an isotropic (non-directional) or an-isotropic (directional) to control the shape and angle of the recesses 208. An isotropic etch may provide for recesses 208 having sloped or angled sides, while an anisotropic etch may provide for recesses 208 having vertical sides.

In FIG. 3B, a die stack 212 is shown that includes a top die 214 having a plurality of bond pads 215 and a plurality of alignment protrusions 216, and the bottom die 200 having alignment recesses 208 formed as discussed above. The alignment protrusions 216 on the top die 214 may be formed by any suitable process, such as by photolithography or stereolithography, as described above in FIG. 2C. To ensure that the bond pads 215 of the top die 214 and the through-wafer vias 202 of the bottom die 200 align, the alignment protrusions 216 of the top die 214 may couple with the recesses 208 of the bottom die 200. As discussed above, these alignment features 216 and 208 may provide better alignment accuracy than the stacking tool, thus ensuring adequate alignment of the bond pads 215 of the top die 214 with the through-wafer vias 202. Similarly, as discussed above, the engagement of the alignment recesses 208 and alignment protrusions 216 may also prevent shifting of the top die 214 and the bottom die 200 during relocation of the die stack 212 to a downstream processing area.

Figure 4C:
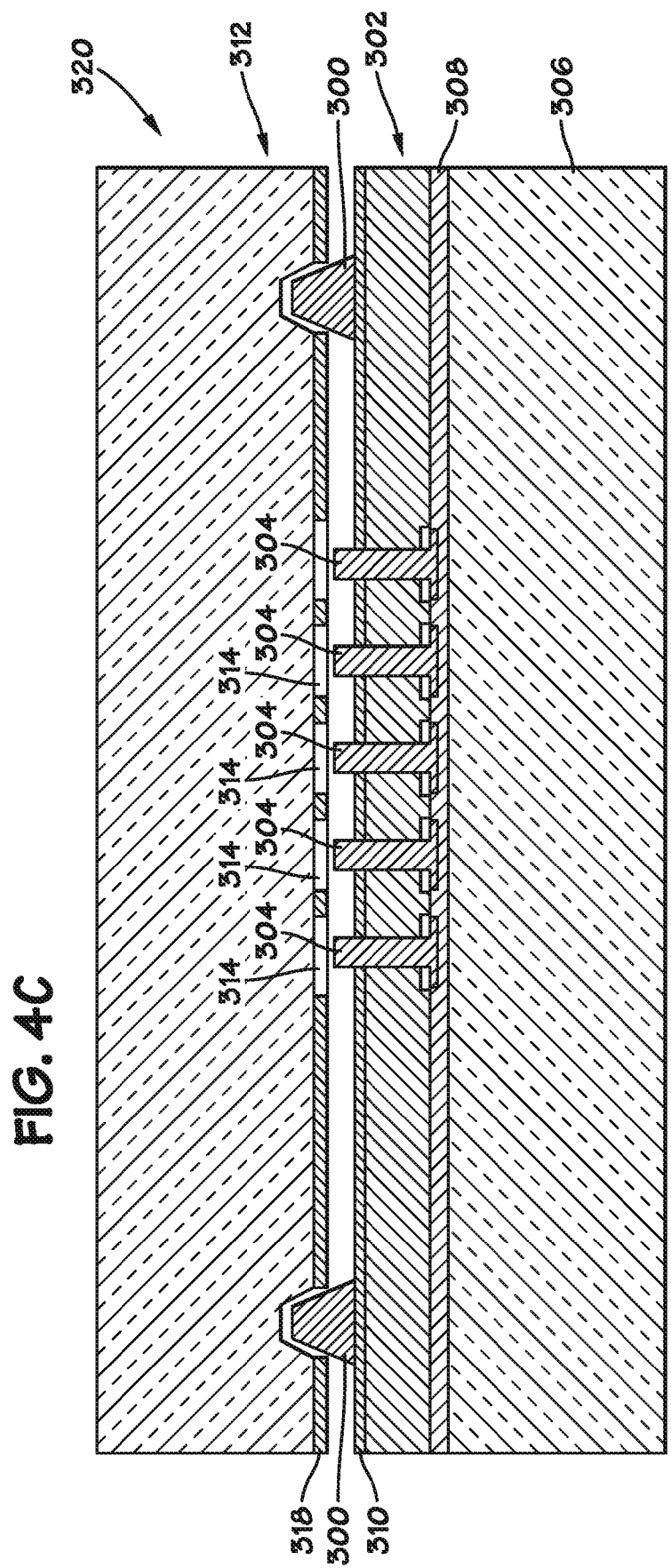

FIGS. 4A-4C illustrate yet another embodiment of the present invention. As illustrated in FIG. 4A, a plurality of alignment protrusions 300 may be formed on a bottom die 302. As illustrated in FIG. 4A, the bottom die 302 has undergone numerous processing steps, such as photolithography and etch to create the through-wafer vias 304, and back grinding to reveal the filled through-wafer vias 304. Additionally, the bottom die 302 is shown ready for stacking and secured to a silicon carrier 306 by an adhesive layer 308. The alignment protrusions 300 may be patterned during or after a backside passivation process of the bottom die 302, as the die 302 may include passivation layer 310. For example, the alignment protrusions 300 may be created during this process using photolithography and a mask, such as an attenuated chrome mask. Advantageously, in this embodiment, creation of the alignment protrusions 300 does not add additional processing steps during lithography and etching, as the alignment protrusions 300 are created during or after a backside passivation process.

FIG. 4B illustrates a top die 312 having bond pads 314 configured to couple to the through-wafer vias 304 of the bottom die 302. The top die 312 also includes a plurality of alignment recesses 316 configured to engage the alignment protrusions 300 of the bottom die 302. In the embodiment depicted in FIG. 4B, the alignment recesses 316 of the top die 312 were patterned and etched after a passivation process, as illustrated by the depiction of passivation layer 318. In an embodiment, the alignment recesses 316 may be patterned and etched during or after a passivation process, as described above.

FIG. 4C illustrates a die stack 320 that includes the bottom die 302 and the top die 312. As discussed above, alignment of the through-wafer vias 304 of the bottom die 302 with the bond pads 314 of the top die 312 may be facilitated by engagement of the alignment features 300 and 316. For example, the alignment protrusions 300 of the bottom die 302 may engage the alignment recesses 316 of the top die 312. Additionally, engagement of the alignment protrusions 300 and the alignment recesses 316 may prevent sliding or movement of the dies 302 and 312 during relocation of the die stack 320 to another area for further processing.

FIGS. 5A and 5B depict a bottom die 400 and a top die 402 having similar alignment features to those described above in FIGS. 4A and 4B. In FIG. 5A, the bottom die 400 is shown having a plurality of through-wafer vias 404 is shown secured to a silicon carrier 406 by an adhesive layer 408. The bottom die 400 may include a plurality of alignment protrusions 410 formed by any of the techniques described above, such as by patterning and etching during a photolithography process, during frontside or backside passivation, etc. In the illustrated embodiment, the alignment protrusions may be formed during or after a backside passivation process, as illustrated by the presence of passivation layer 412.

FIG. 5B depicts a top die 402 having a plurality of bond pads 414 configured to couple to the plurality of through-wafer vias 404 of the bottom die 400. Additionally, the top die 402 includes a plurality of alignment recesses 416 formed during or after a passivation of the top die 402, as illustrated by the depiction of the passivation layer 418. In contrast to the embodiment depicted above in FIG. 4B, the alignment recesses 416 are etched such that they only extend into the passivation layer 418 of the top die 402, and do not extend into the silicon. Advantageously, etching the alignment recesses 416 into the passivation layer 418 prevents any accidental damage to the silicon of the top die 402, and may decrease the likelihood of etching the recesses into the vias or other critical areas of the die 402. The bottom die 400 and top die 402 may be stacked together such as in a die stack depicted by FIG. 4C. The alignment protrusions 410 of the bottom die 400 may engage the alignment recesses 416 in the passivation layer 418 of the top die 402, providing the alignment advantages described above.

Figure 6:
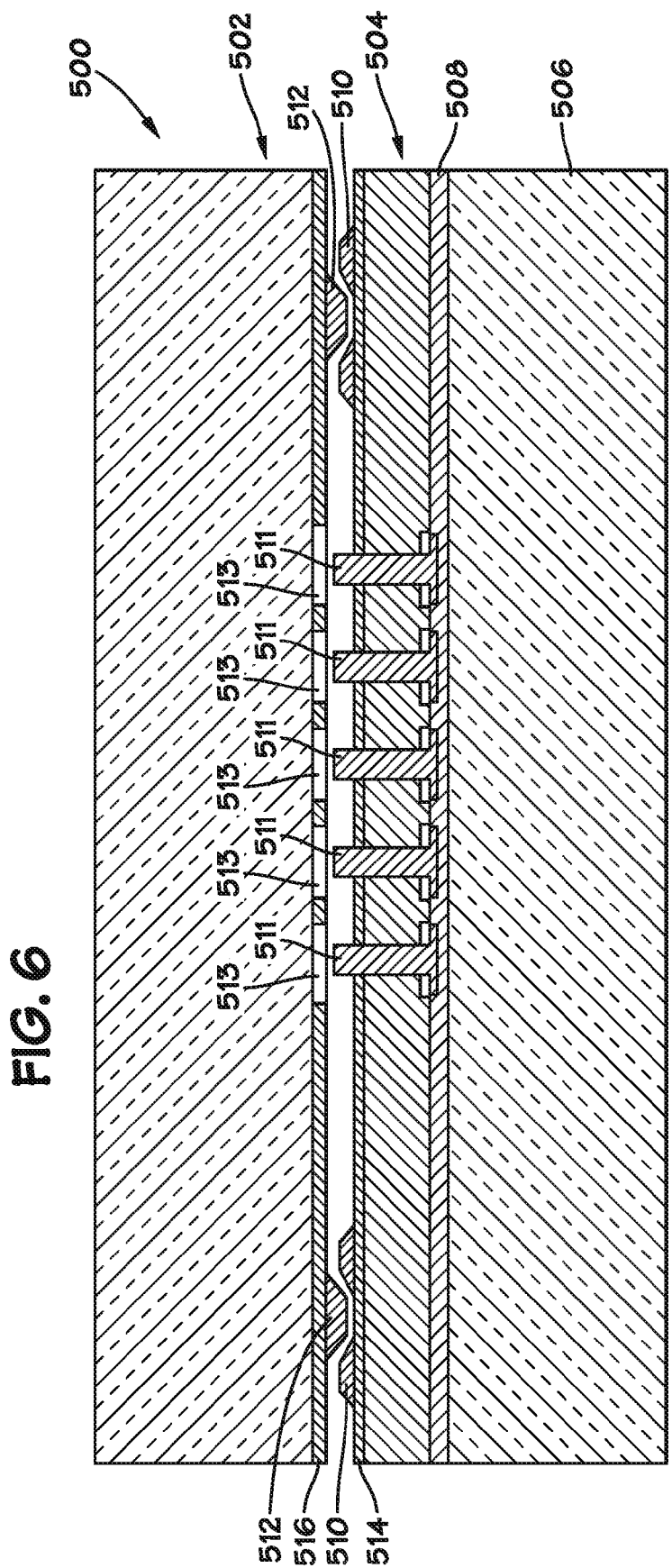
FIG. 6 illustrates formation of alignment protrusions in accordance with another embodiment of the present invention.

FIG. 6 depicts yet another embodiment of alignment features for aligning stacked dies. A die stack 500 illustrated in the figure may include a top die 502 and a bottom die 504, the bottom die 504 being secured to a silicon carrier 506 by adhesive layer 508. In the illustrated embodiment, a plurality of alignment protrusions 510 may be formed in the bottom die 504, and a second plurality of alignment protrusions 512 may be formed in the top die 502. The alignment protrusions 510 and 512 may facilitate alignment of a plurality of through-wafer vias 511 of the bottom die 504 and the bond pads 513 of the top die 502.

For example, as shown in FIG. 5, alignment protrusions 510 on the bottom die 504 may be arranged such that an alignment protrusion 512 on the top die 502 slides between the alignment protrusions 504. As discussed above, the alignment protrusions 512 of the top die 502 and the alignment protrusions 510 of the bottom die 504 may be formed during or after passivation processes that create the passivation layers 514 and 516. The alignment protrusions 510 and 512 may be any size, shape, and topography, and the alignment protrusions 510 on the bottom die 504 may of the same or different size, shape, and topography as the alignment protrusions 512 on the top die 502. Advantageously, creation of the alignment protrusions 510 and 512 on the bottom die 504 or the top die 502 do not require etching into the silicon of the top die 502 or bottom die 504.

As discussed above, in accordance with embodiments of the present invention, various alignment features may be created on two or more die to facility alignment during creation of the die stack. As further described in more detail below, the creation of these alignment features may be performed in an additional step during processing of the dies, or creation of the alignment features may be integrated into an existing processing step. Selection of the technique used to create the alignment features may depend on the size, shape, and type of the alignment features, as well as the additional cost or time needed when processing the wafer. For example, it may be advantageous to minimize costs by integrating creation of the alignment features in an existing processing step of the dies, as opposed to adding a new processing step specifically for formation of the alignment features. Further, the processing steps selected for formation of the alignment features may be different for each die in the stack, and such techniques may be applied to multi-die stacks having two, three, four, or any number of die.

Figure 9:
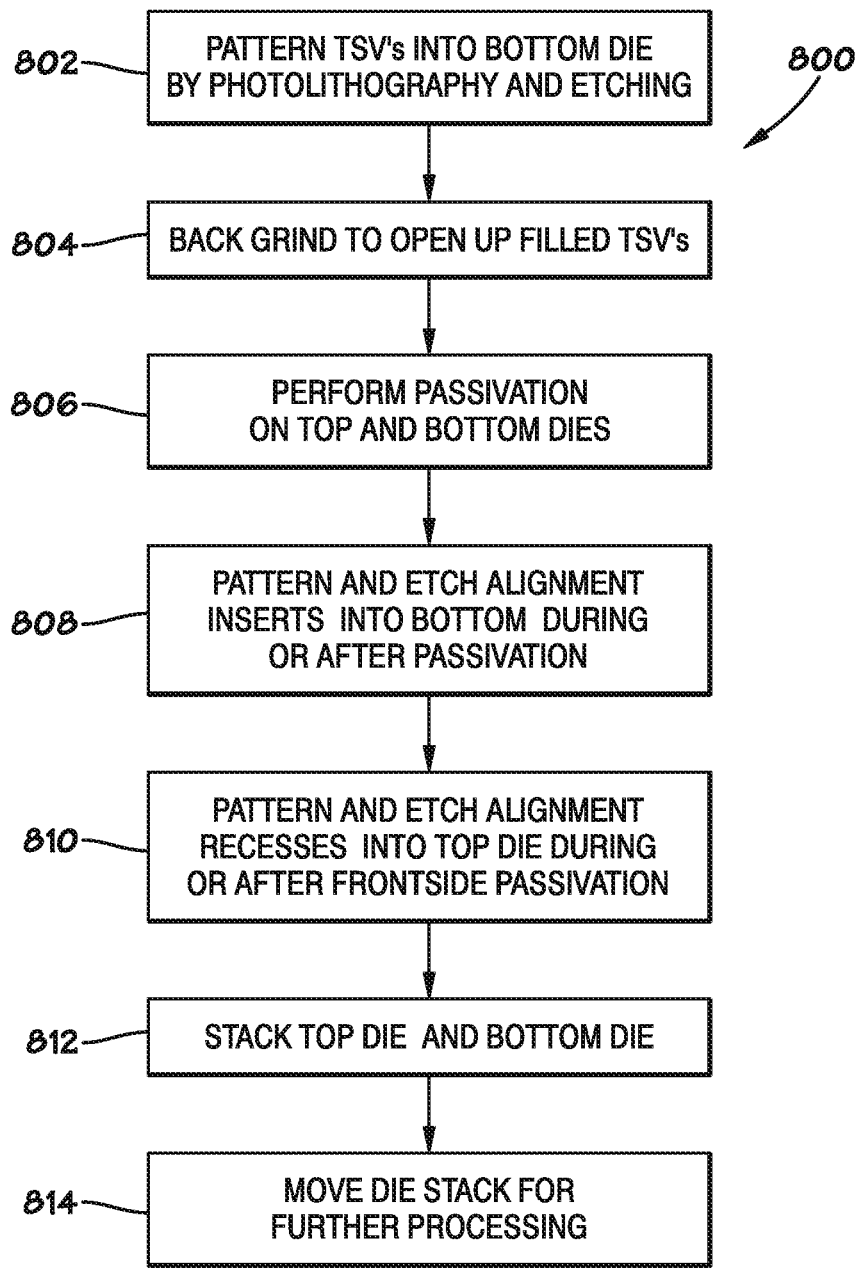
FIG. 9 depicts a process for forming alignment features during passivation processes in accordance with another embodiment of the present invention.

FIGS. 7-9 illustrate processes for formation of various alignment features according to embodiments of the present invention. It should be appreciated that the processes illustrated FIGS. 7-9 may include any additional processing steps before or after formation of the alignment features, and processing of the dies are not limited to the processing steps shown. Further, the processes illustrated may be applied to any number of die, and in some embodiments different dies or combinations of dies may be formed using different processes.

Turning now to FIG. 7, a process 600 for forming alignment features is shown according to an embodiment of the present invention. In FIG. 7, the alignment recesses may be formed during the lithography and etching process used to create the through-wafer vias, such as illustrated in FIGS. 2A-2D. Initially, the through-wafer vias may be patterned into a bottom die by photolithography, etch, and/or any other suitable process (block 602). The alignment recesses may also be patterned and etched during patterning and etching of the through-wafer vias (block 604). In other embodiment, the alignment recesses may be patterned and etched after patterning and etching of the through-wafer vias. After the through-wafer vias and alignment recesses have been patterned and etched, the bottom die may undergo further processing such as carrier attach, back grind, silicon relief, etc. After the through-wafer vias are filled, such as with copper, polymer, or other suitable material, the die may undergo a back grind process to expose the vias and expose the alignment recesses (block 606).

To engage the alignment recesses, alignment protrusions may be patterned into a second or top die (block 608). After formation of the alignment features, a passivation process may be performed on the top and bottom dies to form a passivation layer (block 610). Thus, in this embodiment, passivation layers form on the alignment recesses and alignment protrusions of the bottom and top dies. The bottom die and top die may be stacked, relying on engagement of the alignment protrusions to accurately align the top die and the bottom die (block 612). Once a die stack is formed, the die stack may be moved for further processing (block 614). As discussed above, the alignment features also prevent shifting or movement of the dies in the die stack when the stack is moved, ensuring any bond pads and vias remain aligned for the duration of processing.

FIG. 8 depicts a process 700 for forming alignment features during passivation processes, such as illustrated in FIGS. 3A-3B and 4A-4C, in accordance with another embodiment of the present invention. As discussed above, through-wafer vias may be patterned and etched into a bottom die by photolithography, etch, and/or any suitable process (block 702). The die may undergo further processing, such as a back grind process to open the through-wafer vias (block 704). To facilitate alignment of the die stack, alignment inserts may be patterned into a top die (block 706). Next, passivation processes may be performed on the bottom and top die (block 708). To create alignment features in the bottom die, alignment recesses may be patterned and etched into the bottom die during a passivation process (block 710). Once both dies have alignment features, the die may be stacked to form a die stack, using the engagement of the alignment features to accurately align the bond pads and through-wafer vias of the dies (block 712). The die stack may also be moved on for further processing with the engaged alignment features preventing the dies from shifting during movement of the stack (block 714).

Turning now to FIG. 9, a process 800 for forming alignment features during passivation processes, such as depicted in FIGS. 3A-3B and 4A-4C, is illustrated in accordance with another embodiment of the present invention. Initially, through-wafer vias may be patterned and etched into a bottom die (block 802) and the die may under go further processing, such as a back grind process to expose the through-wafer vias (block 804). Next, both the bottom die and a top die may undergo passivation processes (block 806). During or after backside passivation of the bottom die, alignment protrusions may be pattern and etched onto the bottom die (block 808). Similarly, during or after frontside passivation of the top die, alignment recesses may be patterned and etched onto the top die (block 810). After formation of the respective alignment features during the passivation processes, the top and bottom dies may be stacked to form a die stack (block 812), using the engagement of the alignment protrusions and alignment recesses to accurately align the die. The die stack may then be moved for further processing, with the engaged alignment features further stabilizing the stack (block 814).

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:
1. A method of forming a die stack, comprising:
 forming a plurality of through-wafer vias extending through a planar surface of a first die;
 forming one or more alignment features directly on a first surface of the first die, wherein the first surface comprises the planar surface of the first die, wherein the one or more alignment features are electrically separate from and non-conducting with the through-wafer vias, wherein none of the plurality of through-wafer vias are formed between the one or more alignment features and an edge of the planar surface comprising a die street of the first die, wherein the one or more alignment features comprise at least one protrusion extending from the first die; and creating one or more second alignment features in a second die, wherein the one or more second alignment features comprise a plurality of protrusions extending from the second die, wherein the second alignment features are configured to engage the one or more alignment features of the first die.

2. The method of claim 1, comprising stacking the second die on the first die.

3. The method of claim 1, wherein forming the one or more alignment features comprises forming the one or more alignment features by photolithography, stereolithography, wet etch, dry etch, passivation, or a combination thereof.

4. The method of claim 1, comprising picking the first die and placing the first die onto the second die such that the alignment features of the first die engage the alignment features of the second die.

5. The method of claim 1, comprising placing the die stack in a curing oven.

6. A method of manufacturing a die stack, comprising:
   forming a plurality of through-wafer vias extending through a planar surface of a first die;
   filling the plurality of through-wafer vias with conducting material;
   forming a plurality of recesses directly on a first surface of the first die, wherein the first surface comprises the planar surface of the first die;
   forming a plurality of protrusions on a second surface of a second die, wherein the plurality of protrusions are configured to engage the plurality of recesses to align a plurality of bond pads of the second die with the plurality of through-wafer vias of the first die; and
   forming a plurality of plurality of bond pads of the second die, wherein the plurality of bond pads of the second die align with the conducting material of the plurality of through-wafer vias, wherein a gap is formed between each of the plurality of bond pads and the conducting material of the plurality of through-wafer vias when the plurality of protrusions engage the plurality of recesses.

7. The method of claim 6, comprising stacking the first die onto the second die such that the plurality of recesses engage the plurality of protrusions.

8. The method of claim 6, comprising stacking the second die onto the first die such that the plurality of protrusions engage the plurality of recesses.

9. The method of claim 6, wherein forming the plurality of recesses on the first die comprises forming a plurality of recesses in a layer disposed on the first die.

10. The method of claim 9, wherein the layer comprises a passivation layer.

11. A method of manufacturing a semiconductor device, comprising:
    forming a plurality of alignment features in a wafer by a photolithograpy process, a passivation process, or a combination thereof;
    dicing the wafer into a plurality of dies, such that each die comprises one or more of the plurality of alignment features directly on a planar surface of each die, wherein the one or more of the plurality of alignment features comprise at least one protrusion extending from each die to engage at least one protrusion of another die of the plurality of dies; and
    forming a plurality of through-wafer vias extending through the planar surface of a first die of the plurality of dies, wherein the one or more alignment features are electrically separate from and non-conducting with the through-wafer vias, wherein none of the plurality of through-wafer vias are formed between the one or more alignment features and an edge of the planer surface comprising a die street of the first die.

12. The method of claim 11, wherein forming the plurality of alignment features comprising forming one or more of the plurality of alignment features at a plurality of die streets of the wafer.

13. A die stack, comprising:
    a first die having a first plurality of alignment features directly on a planar surface of the first die and a plurality of through-wafer vias extending through the planar surface, wherein the first plurality of alignment features are electrically separate from and non-conducting with the through-wafer vias; and
    a second die having a second plurality of alignment features and a plurality of bond pads, wherein the second plurality of alignment features of the second die are configured to engage the first plurality of alignment features of the first die, such that the plurality of bond pads of the second die align with the plurality of through-wafer vias of the first die, wherein the first plurality of alignment features and the second plurality of alignment features comprise a plurality of protrusions.

14. The die stack of claim 13, wherein the plurality of bond pads of the second die are configured to engage the plurality of through-wafer vias of the first die.

15. A die stack, comprising:
    a first die having a first plurality of alignment features directly on a planar surface of the first die and a plurality of through-wafer vias each filled with conducting material and extending through the planar surface; and
    a second die having a second plurality of alignment features and a plurality of bond pads, wherein the second plurality of alignment features of the second die are configured to engage the first plurality of alignment features of the first die, such that the plurality of bond pads of the second die align with the plurality of through-wafer vias of the first die, wherein the plurality of bond pads of the second die align with the conducting material of the plurality of through-wafer vias, wherein a gap is formed between each of the plurality of bond pads and the conducting material of the plurality of through-wafer vias when the first plurality of alignment features engage the second plurality of alignment features.

16. A die stack, comprising:
    a first die having a first plurality of alignment features directly on a planar surface of the first die and a plurality of through-wafer vias each filled with conducting material and extending through the planar surface; and
    a second die having a second plurality of alignment features and a plurality of bond pads, wherein the second plurality of alignment features of the second die are configured to engage the first plurality of alignment features of the first die, such that the plurality of bond pads of the second die align with the plurality of through-wafer vias of the first die, wherein the first plurality of alignment features comprises a plurality of recesses, wherein the second plurality of alignment features comprises a plurality of protrusions extending from the surface of the die, wherein the plurality of bond pads of the second die align with the conducting material of the plurality of through-wafer vias, wherein a gap is formed between each of the plurality of bond pads and the conducting material of the plurality of through-wafer vias when the plurality recesses engage the plurality protrusions.

17. A system comprising:
an electronic device comprising:
a processor; and
one or more semiconductor devices, wherein the one or more semiconductor devices comprises a die stack, wherein the die stack comprises:
a first die having a plurality of alignment protrusions directly on a first surface of the first die and formed by photolithography, wherein the first surface comprises a planar surface of the first die;
a plurality of through-wafer vias extending through the planar surface of the first die, wherein the plurality of alignment protrusions are electrically separate from and non-conducting with the through-wafer vias, wherein none of the plurality of through-wafer vias are formed between the plurality of alignment protrusions and an edge of the planar surface comprising a die street of the first die; and
a second die having a second plurality of alignment protrusions configured to engage the one or more alignment protrusions of the first die.

18. A die stack, comprising:
a first die having a first plurality of protrusions extending from a first surface of the first die and a plurality of through-wafer vias; and
a second die having a second plurality of protrusions extending from a second surface of the second die, wherein the second plurality of protrusions are configured to engage the first plurality of protrusions.

* * * * *